US006850127B2

(12) United States Patent
Sakakura et al.

(10) Patent No.: US 6,850,127 B2
(45) Date of Patent: Feb. 1, 2005

(54) LAMINATED ELECTRONIC COMPONENT

(75) Inventors: Mitsuo Sakakura, Tamagawa-Mura (JP); Shigeru Komiyama, Tamagawa-Mura (JP); Masahide Takashima, Tamagawa-Mura (JP); Yoshinori Itoh, Tamagawa-Mura (JP)

(73) Assignee: Toko Kabushiki Kaisha, Tokyo-To (JP)

( * ) Notice: Subject to any disclaimer, the term of this patent is extended or adjusted under 35 U.S.C. 154(b) by 217 days.

(21) Appl. No.: 10/153,923

(22) Filed: May 24, 2002

(65) Prior Publication Data
US 2002/0175002 A1 Nov. 28, 2002

(30) Foreign Application Priority Data

May 25, 2001 (JP) ........................................ 2001-157244
Feb. 28, 2002 (JP) ........................................ 2002-053332

(51) Int. Cl.[7] .............................. H03H 7/42; H01P 5/10
(52) U.S. Cl. ............................ 333/25; 333/26; 333/185
(58) Field of Search ............................ 333/25, 26, 129, 333/131, 132, 134, 185

(56) References Cited

U.S. PATENT DOCUMENTS 5,949,299 A * 9/1999 Harada ........................ 333/25
6,788,164 B2 * 9/2004 Maekawa et al. ............. 333/26

FOREIGN PATENT DOCUMENTS

JP  2000-236227 A * 8/2000 ............ H03H/7/42

* cited by examiner

Primary Examiner—Robert Pascal
Assistant Examiner—Dean Takaoka
(74) Attorney, Agent, or Firm—Pillsbury Winthrop LLP

(57) ABSTRACT

A laminated electronic component in which insulating layers and conductive patterns are stacked to form a filter and a balun within the stacked body to connect the filter and the balun between an unbalanced terminal and a pair of balanced terminals.

17 Claims, 11 Drawing Sheets

| | PASSBAND FREQUENCY | INSERTION LOSS | FREQUENCY OF ATTENUATION POLE | ATTENUATION OF ATTENUATION POLE | IMPEDANCE RATIO |
|---|---|---|---|---|---|
| 1 | 2.11~2.17GHz | 3.46dB | 1.74GHz | 46.86dB | 50:50 |
| 2 | 2.11~2.17GHz | 2.04dB | 1.74GHz | 35.4dB | 50:50 |
| 3 | 2.4~2.5GHz | 1.89dB | 1.98GHz | 31.6dB | 50:100 |
| 4 | 2.4~2.5GHz | 1.92dB | 2GHz | 30.17dB | 50:100 |

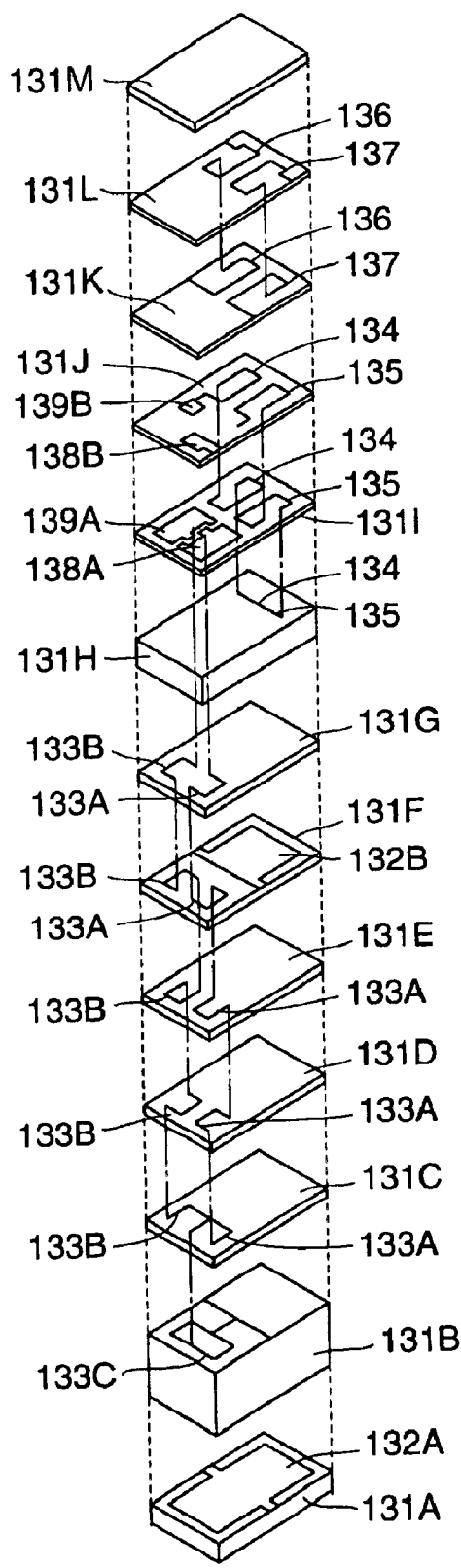
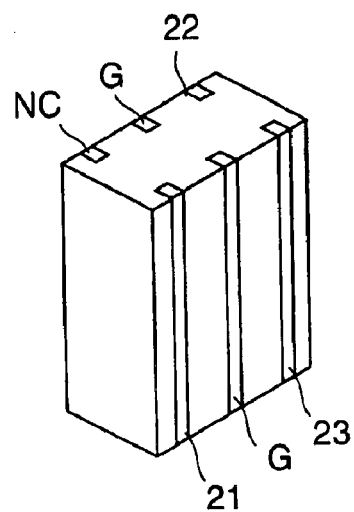
FIG.13
FIG.14

LAMINATED ELECTRONIC COMPONENT

FIELD OF THE INVENTION

This invention relates to a laminated electronic component used at a high frequency (microwave) communication equipment such as a mobile communication terminal or wireless LAN, etc.

RELATED ART

As a mobile communication terminal, as shown in FIG. 22, there is employed a mobile communication terminal in which a receiving circuit 223 and a transmitting circuit 224 are connected through a switching element 222 connected to an antenna 221. In this mobile communication terminal, by alternatively switching the switching element 222 at a high speed, a receive signal from the antenna 221 is transmitted to the receiving circuit 223, and a transmit signal from the transmitting circuit 224 is transmitted to the antenna 221. The receiving circuit 223 of this mobile communication terminal is caused to be of the configuration in which a filter 227 is inserted between a high frequency amplifier 225 and a frequency mixer 226.

In recent years, mobile communication terminals of this kind have been constituted by several ICs, passive components of their peripheral circuits, and filter. Moreover, because such ICs are used in mobile communication terminals in which power saving is being carried out, drive voltage is caused to be low. Under such circumstances, in mobile communication terminals of this kind, with a view to improving signal-to-noise ratio followed by lowering of drive voltage, ICs of the balanced input/output type are being used for frequency mixer, etc.

However, as the switching element 222 and/or the high frequency amplifier 225, there are many elements of the unbalanced type up to now. For this reason, it has become popular for the filter 227 of the receiving circuit 223 to use discrete components or parts as circuit element constituting filter to form element of the unbalanced type on a printed board of the mobile communication terminal, or to mount element of the unbalanced type in which circuit element constituting filter is integrally formed on a printed board of the mobile communication terminal. Moreover, in ICs of the balanced input/output type used in the frequency mixer, etc., input impedance is, e.g., value of 100 ohms or 200 ohms, and is generally different from output impedance of the filter. Accordingly, in the mobile communication terminal of this kind, in order to convert an unbalanced signal outputted from the filter 227 into a balanced signal, and to take matching of impedance between the filter 227 and the frequency mixer 226, it was necessary to insert a balun 228 between the filter 227 and the frequency mixer 226 as shown in FIG. 23. As stated above, in order to insert the balun 228 between the filter 227 and the frequency mixer 226, space for mounting the balun 228 and space for forming wiring pattern for connecting the balun 228 and the filter 227 and the balun 228 and the frequency mixer 226 are required on a printed board of the mobile communication terminal.

Moreover, in the mobile communication terminal of this kind, since the high frequency amplifier 225, the filter 227, the balun 228 and the frequency mixer 226 are connected in succession through wiring pattern of the printed board of the mobile communication terminal, it is necessary to allow input/output impedance of the filter 227 and input impedance of the balun 228 to be equal to 50Ω in order to take matching impedance between the filter 227 and the balun 228. For this reason, the characteristic of the filter is limited by input/output impedance, there were cases where function as the filter is not sufficiently exhibited.

An object of this invention is to provide a laminated electronic component which can contribute to miniaturization of high frequency (microwave) communication equipment and can improve the characteristic of the filter.

SUMMARY OF THE INVENTION

A laminated electronic component of this invention is adapted so that insulating layers and conductive patterns are stacked to form a filter and a balun within the stacked body to connect the filter and the balun between an unbalance terminal and a pair of balanced terminals. The filter is constituted by band-pass filter or low-pass filter.

Moreover, a laminated electronic component of this invention may be adapted so that insulating layers and conductive patterns are stacked to form, within the stacked body, a band-pass filter in which a first resonator and a second resonator are electromagnetically coupled, and a balun in which a first coil and a second coil are connected, a third coil having one end grounded is electromagnetically coupled to the first coil, and a fourth coil having one end grounded is electromagnetically coupled to the second coil, the band-pass filter and the balun being connected between an unbalanced terminal and a pair of balanced terminals. The band-pass filter and the balun may be formed within the stacked body so that they are stacked with each other in a stacking direction of the stacked body, or may be formed within the stacked body in the state laterally shifted so that they are not overlaid with each other.

Further, a laminated electronic component of this invention is adapted so that insulating layers and conductive patterns are stacked to form a low-pass filter in which a first coil and a first capacitor are connected in parallel, a second capacitor is connected between one end of the first coil and earth and a third capacitor is connected between the other end of the first coil and the earth, and a balun in which a second coil and a third coil are connected, a fourth coil having one end grounded is electromagnetically coupled to the second coil, and a fifth coil having one end grounded is electromagnetically coupled to the third coil, the low-pass filter and the balun being connected between an unbalanced terminal and a pair of balanced terminals. The low-pass filter and the balun may be formed within the stacked body so that they are stacked with each other in a stacking direction of the stacked body, or may be formed within the stacked body in the state laterally shifted so that they are not overlaid with each other.

BRIEF DESCRIPTION OF THE DRAWINGS

FIG. 13 is an exploded perspective view showing the fifth embodiment of the laminated electronic component of this invention.

FIG. 14 is a perspective view of the fifth embodiment of the laminated electronic component of this invention.

DESCRIPTION OF THE PREFERRED EMBODIMENTS

A laminated electronic component of this invention is adapted so that insulating layers and conductive patterns are stacked, and a filter and a balun are integrally formed within the stacked body. The filter and the balun are connected between an unbalanced terminal and a pair of balanced terminals provided at the stacked body. Accordingly, the laminated electronic component of this invention can set output impedance of the filter without undergoing influence of output impedance of the balun required in accordance with input impedance (e.g., 100 ohms or 200 ohms) of IC. In this laminated electronic component, the unbalanced terminal is connected to the unbalanced line, and a pair of balanced terminals are connected to the balanced line.
Preferred Embodiments The laminated electronic component of this invention will now be described with reference to FIGS. 1 to 21.

Figure 1:
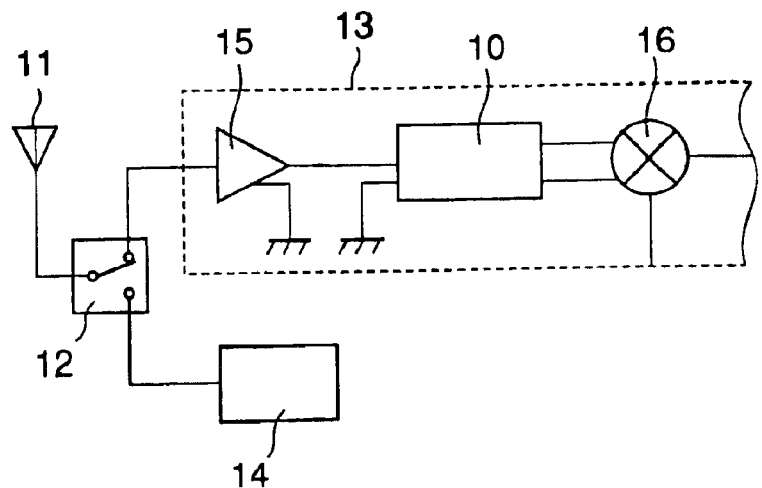
FIG. 1 is a circuit diagram showing a circuit example of a high frequency (microwave) communication equipment using a laminated electronic component of this invention.
Figure 2:
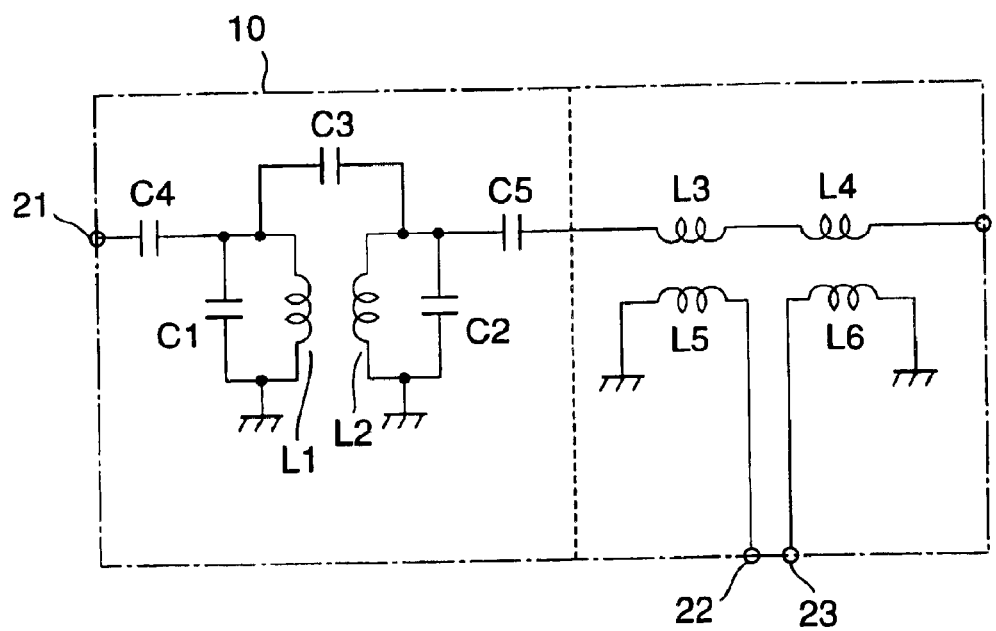
FIG. 2 is a circuit diagram of the laminated electronic component of this invention.
Figure 3:
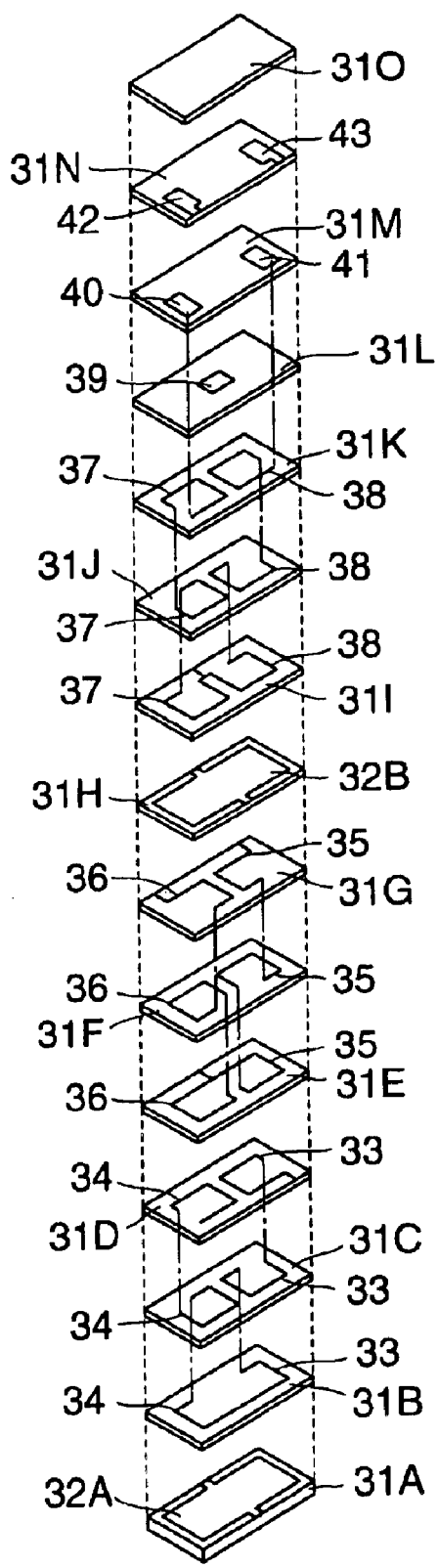
FIG. 3 is an exploded perspective view showing a first embodiment of the laminated electronic component of this invention.

FIG. 1 is a circuit diagram showing a circuit example of a high frequency (microwave) communication equipment using the laminated electronic component of this invention, FIG. 2 is a circuit diagram of the laminated electronic component of this invention, and FIG. 3 is an exploded perspective view showing a first embodiment of the laminated electronic component of this invention.

In the mobile communication terminal using the laminated electronic component of this invention, an antenna 11 is connected to the common terminal of a switching element 12, and a receiving circuit 13 and a transmitting circuit 14 are respectively connected to branch ends of the switching element 12. Further, laminated electronic component 10 of this invention is inserted between the output terminal of a high frequency amplifier 15 of the receiving circuit 13 and the input terminal of IC of the balanced input/output type used in a frequency mixer 16.

In this laminated electronic component 10, within a stacked body of insulating layers and conductive patterns, there are formed a filter connected to the unbalanced terminal and a balun connected between this filter and a pair of balanced terminals. This laminated electronic component 10 is mounted on a printed board of the mobile communication terminal. Further, the unbalanced terminal of this laminated electronic component 10 is connected to the unbalanced transmission line connected to the output terminal of the high frequency amplifier 15. In addition, a pair of balanced terminals of the laminated electronic component 10 are connected to the balanced transmission line connected to the input terminal of IC used in the frequency mixer 16.

The filter and the balun of this laminated electronic component 10 are constituted, as shown in FIG. 2, for example, a band-pass filter formed by electromagnetically coupling a first resonator in which a coil L1 and a capacitor C1 are connected in parallel and a second resonator in which a coil L2 and a capacitor C2 are connected in parallel, and a balun of the so-called marchand type in which a coil L3 and a coil L4 are connected, a coil L5 having one end grounded is electromagnetically coupled to the coil L3 and a coil L6 having one end grounded is electromagnetically coupled to the coil L4. In this band-pass filter, junction of the coil L1 and the capacitor C1 is connected to an unbalanced terminal 21 through a capacitor C4, and junction of the coil L2 and the capacitor C2 is connected to the coil L3 of the balun through a capacitor C5. In this balun, the coil L5 is connected to a balanced terminal 22 and the coil L6 is connected to a balanced terminal 23.

In this case, capacitor C3 of the band-pass filter is capacity resulting from the fact that two resonators are caused to undergo capacitive coupling, and the other end of the coil L4 of the balun is in electrically floating state.

Such filter and balun are formed within stacked body by stacking insulating layers and conductive patterns as shown in FIG. 3.

The insulting layers 31A to 31O are formed by using material having insulating property such as magnetic material, non-magnetic material or dielectric material, etc.

On the surface of the insulating layer 31A, a conductive pattern 32A for earth is formed. This earth conductive pattern 32A is drawn out toward the opposite end surface of the insulating layer 31A.

On the surfaces of the insulting layers 31B, 31C, 31D, conductive patterns 33 for coil and conductive patterns 34 for coil are respectively formed. Moreover, the coil L3 is formed by spirally connecting the coil conductive patterns 33 of the insulating layers 31B to 31D via through holes. Further, the coil L4 is formed by spirally connecting the coil conductive patterns 34 of the insulating layers 31B to 31D via through holes. The coil L3 and the coil L4 are connected to each other by connecting the coil conductive patterns 33 and the coil conductive patterns 34 of the surfaces of the insulating layers 31B to 31D. In addition, the coil L3 and the coil L4 are adapted so that the end portion of the coil conductive pattern 33 of the insulating layer 31D constituting one end of the coil L3 is drawn out toward the end surface of the insulating layer 31A, and the end portion of the coil conductive pattern 34 of the insulating layer 31D constituting the other end of the coil L4 is extended at the position spaced from the end surface of the insulating layer 31D.

On the surface of the insulating layer 31E, a conductive pattern 35 for coil and a conductive pattern 36 for coil are formed. This coil conductive pattern 35 is formed in a manner opposite to the coil conductive pattern 33 through the insulating layer 31E. Moreover, the coil conductive pattern 36 is formed in a manner opposite to the coil conductive pattern 34 through the insulating layer 31E.

On the surfaces of the insulating layers 31F, 31G, the coil conductive patterns 35 and the coil conductive patterns 36 are formed. Further, the coil L5 is formed by spirally connecting the coil conductive patterns 35 of the insulating layers 31E to 31G via through holes. Moreover, the coil L6 is formed by spirally connecting the coil conductive patterns 36 of the insulating layers 31E to 31G via through holes. The coil L3 and the coil L4 are connected to each other by connecting the coil conductive pattern 35 and the coil conductive pattern 36 of the surface of the insulating layer 31E, and junction of the coil conductive pattern 35 and the coil conductive pattern 36 is drawn out toward the end surface of the insulating layer 31E. In addition, the end portion of the coil conductive pattern 35 of the insulating layer 31G constituting one end of the coil L5 and the end portion of the coil conductive pattern 36 of the insulating layer 31G constituting the other end of the coil L6 are drawn out toward the same end surface of the insulating layer 31G.

On the surface of the insulating layer 31H, a conductive pattern 32B for earth is formed. This earth conductive pattern 32B is drawn out toward the opposite end surface of the insulating layer 31H.

On the surfaces of the insulating layers 31I, 31J, 31K, conductive patterns 37 for coil and conductive patterns 38 for coil are formed. Moreover, the coil L1 is formed by spirally connecting the coil conductive patterns 37 of the insulating layers 31I to 31K via through holes. Further, the coil L2 is formed by spirally connecting the coil conductive patterns 38 of the insulating layers 31I to 31K via through holes. The coil L1 and the coil L2 are connected to each other by connecting the coil conductive pattern 37 and the coil conductive pattern 38 of the insulating layer 31I, and junction of the coil conductive pattern 37 and the coil conductive pattern 38 is drawn out toward the end surface of the insulating layer 31I. Further, the capacitor C1 is formed in parallel with the coil L1 by capacity formed between the coil conductive patterns 37 of the insulating layers 31I to 31K and capacity formed between the coil conductive pattern 37 of the insulating layer 31I and the earth conductive pattern 32B. In addition, the capacitor C2 is formed in parallel with the coil L2 by capacity formed between the coil conductive patterns 38 of the insulating layers 31I to 31K and capacity formed between the coil conductive pattern 38 of the insulating layer 31I and the earth conductive pattern 32B.

On the surface of the insulating layer 31L, a conductive pattern 39 for capacitive coupling is formed. The capacitive coupling conductive pattern 39 is formed on the surface of the insulating layer 31L in such a manner to bridge the coil L1 and the coil L2 through the insulating layer 31L. The capacitor C3 is formed by capacity between this capacitive coupling conductive pattern and the coils L1, L2 and capacity between the coil L1 and the coil L2.

On the surface of the insulating layer 31M, a conductive pattern 40 for capacity and a conductive pattern 41 for capacity are formed. The capacity conductive pattern 40 is connected to the coil conductive pattern 37 of the insulating layer 31K via through holes of the insulating layers 31M, 31L. Moreover, the capacity conductive pattern 41 is connected to the coil conductive pattern 38 of the insulating layer 31K via through holes of the insulating layers 31M, 31L.

On the surface of the insulating layer 31N, a conductive pattern 42 for capacity and a conductive pattern 43 for capacity are formed. The capacity conductive pattern 42 is formed at the position opposite to the capacity conductive pattern 40 through the insulating layer 31N. The capacitor C4 is formed between this capacity conductive pattern 40 and the capacity conductive pattern 42. The capacity conductive pattern 43 is formed at the position opposite to the capacity conductive pattern 41 through the insulating layer 31N. The capacitor C5 is formed between this capacity conductive pattern 41 and the capacity conductive pattern 43. This capacity conductive pattern 42 and the capacity conductive pattern 43 are drawn out up to the same end surface of the insulating layer 31N. In addition, this capacity conductive pattern 42 and the capacity conductive pattern 43 are covered by the insulating layer 31O.

Figure 4:
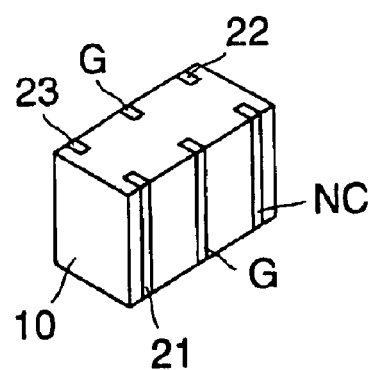
FIG. 4 is a perspective view of the first embodiment of the laminated electronic component of this invention.

At the side surface of the stacked body stacked in this way, there are formed the unbalanced terminal 21, the balanced terminals 22, 23, a pair of ground terminals G, and an internal conductive pattern connection terminal NC as shown in FIG. 4. Further, the capacity conductive pattern 42 is connected to the unbalanced terminal 21. Further, the earth conductive patterns 32A, 32B are connected to the ground terminals G. Further, the capacity conductive pattern 43 and the coil conductive pattern 33 of the insulating layer 31D are connected to the internal conductive pattern connection terminal NC. Furthermore, the coil conductive pattern 35 of the insulating layer 31G is connected to the balanced terminal 22. In addition, the coil conductive pattern 36 of the insulating layer 31G is connected to the balanced terminal 23.

The band-pass filter and the balun of this laminated electronic component are formed within the stacked body in such a manner that they are stacked in a stacking direction of the insulating layers.

In such laminated electronic component, in the case where a signal is inputted from the unbalanced terminal, an inputted unbalanced signal passes through the filter and the balun. Thus, a balanced signal is outputted from the balanced terminal.

Figure 5:
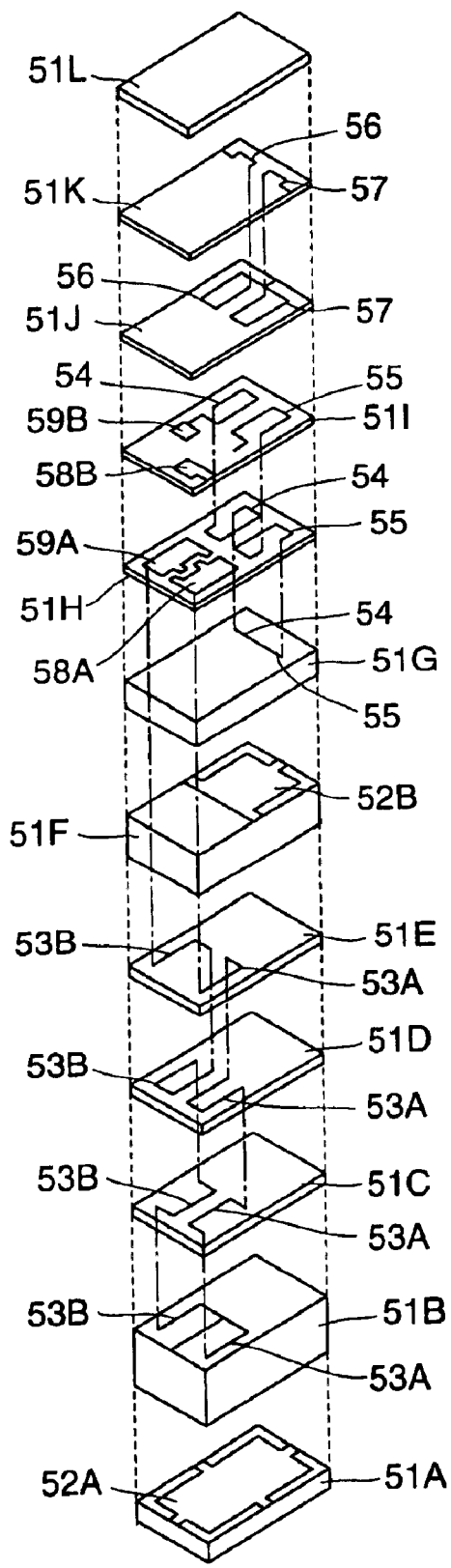
FIG. 5 is an exploded perspective view showing a second embodiment of the laminated electronic component of this invention.

FIG. 5 is an exploded perspective view showing a second embodiment of the laminated electronic component of this invention.

On the surface of an insulating layer 51A, a conductive pattern 52A for earth is formed. This earth conductive pattern 52A is drawn out toward four end surfaces of the insulating layer 51A.

On the surfaces of insulating layers 51B, 51C, 51D, 51E, conductive patterns 53A for coil and conductive patterns 53B for coil are respectively formed. The coil conductive patterns 53A and the coil conductive patterns 53B are formed in the state arranged in a width direction of the insulating layers at the one side half surface (left half surface in FIG. 5) of the insulating layers. Further, the coil L1 is formed by spirally connecting the coil conductive patterns 53A of the insulating layers 51B to 51E via through holes. Further, the coil L2 is formed by spirally connecting the coil conductive patterns 53B of the insulating layers 51B to 51E via through holes. The coil L1 and the coil L2 are connected to each other by connecting the coil conductive pattern 53A and the coil conductive pattern 53B of the surface of the insulating layer 51B. Further, junction of the coil L1 and the coil L2 is drawn out toward the end surface of the insulating layer 51B. Further, the capacitor C1 is formed in parallel with the coil L1 by capacity formed between the coil conductive patterns 53A of the insulating layers 51B to 51E and capacity formed between the coil conductive pattern 53A of the insulating layer 51B and the earth conductive pattern 52A. In addition, the capacitor C2 is formed in parallel with the coil L2 by capacity formed between the coil conductive patterns 53B of the insulating layers 51B to 51E and capacity formed between the coil conductive pattern 53B of the insulating layer 51B and the earth conductive pattern 52A.

On the surface of an insulating layer 51F, a conductive pattern 52B for earth is formed. This earth conductive pattern 52B is drawn out toward three end surfaces of the insulating layer 51F.

On the surface of an insulating layer 51G, a conductive pattern 54 for coil and a conductive pattern 55 for coil are formed. The coil conductive pattern 54 and the coil conductive pattern 55 are formed at one side half surface (right half surface in FIG. 5) of the insulating layer, and are connected to each other.

On the surface of an insulating layer 51H, the coil conductive patterns 54, 55 and conductive patterns 58A, 59A for capacity are formed. The coil conductive pattern 54 and the coil conductive pattern 55 are formed in the state arranged in a width direction of the insulating layer at one side half surface (right half surface in FIG. 5) of the insulating layer 51H. Moreover, the capacity conductive pattern 58A and the capacity conductive pattern 59A are formed in the state arranged in a width direction of the insulating layer at the remaining half surface (left half surface in FIG. 5) of the insulating layer 51H. This capacity conductive pattern 58A is connected to the coil conductive pattern 53A via through holes of the insulating layers 51F to 51H. Further, the capacity conductive pattern 59A is connected to the coil conductive pattern 53B via through holes of the insulating layers 51F to 51H. In addition, the capacitor C3 is formed by capacity formed between the capacity conductive pattern 58A and the capacity conductive pattern 59A and capacity between the coil L1 and the coil L2.

On the surface of an insulating layer 51I, the coil conductive patterns 54, 55 and conductive patterns 58B, 59B for capacity are formed. The coil conductive pattern 54 and the coil conductive pattern 55 are formed in the state arranged in a width direction of the insulating layer at one side half surface (right half surface in FIG. 5) of the insulating layer 51I. Moreover, the capacity conductive pattern 58B and the capacity conductive pattern 59B are formed in such a manner that the capacity conductive pattern 58B is opposite to the capacity conductive pattern 58A and the capacity conductive pattern 59B is opposite to the capacity conductive pattern 59A at the remaining half surface (left half surface in FIG. 5) of the insulating layer 51I. Further, the coil L3 is formed by spirally connecting the coil conductive patterns 54 of the insulating layers 51G to 51I via through holes. Further, the coil L4 is formed by spirally connecting conductive patterns 55 for coil of the insulating layers 51G to 51I. The coil L3 and the coil L4 are connected to each other by connecting the coil conductive pattern 54 and the coil conductive pattern 55 of the insulating layer 51G. This coil L3 is connected to the coil L2 through the capacitor C5 formed by capacity between the capacity conductive pattern 59A and the capacitor conductive pattern 59B by connecting the coil conductive pattern 54 and the capacity conductive pattern 59B of the insulating layer 51I. Further, the coil L4 is adapted so that one end of the coil conductive pattern 55 of the insulating layer 51I is extended at the position spaced from the end surface of the insulating layer 51I without being connected to any portion, whereby one end thereof is in electrically floating state. In addition, the capacitor C4 is formed by capacity formed between the capacity conductive pattern 58A and the capacity conductive pattern 58B.

On the surface of an insulating layer 51J, a conductive pattern 56 for coil and a conductive pattern 57 for coil are formed. The coil conductive pattern 56 and the coil conductive pattern 57 are formed in the state arranged in a width direction of the insulating layer at one side half surface (right half surface in FIG. 5) of the insulating layer 51J. This coil conductive pattern 56 is opposed to the coil conductive pattern 54 through the insulating layer 51J. Moreover, the coil conductive pattern 57 is opposed to the coil conductive pattern 55 through the insulating layer 51J. The coil conductive pattern 56 and the coil conductive pattern 57 are connected to each other. The junction of the coil conductive pattern 56 and the coil conductive pattern 57 is drawn out toward the end surface of the insulating layer 51J.

On the surface of an insulating layer 51K, the coil conductive pattern 56 and the coil conductive pattern 57 are formed. The coil conductive pattern 56 and the coil conductive pattern 57 are formed in the state arranged in a width direction of the insulating layer at one side half surface (right half surface in FIG. 5) of the insulating layer 51K. One end of the coil conductive pattern 56 and one end of the coil conductive pattern 57 are drawn out toward opposite end surfaces of the insulating layer 51K. Moreover, the coil conductive pattern 56 and the coil conductive pattern 57 are covered by an insulating layer 51L. Further, the coil L5 is formed by spirally connecting the coil conductive patterns 56 of the insulating layers 51J, 51K via through holes. In addition, the coil L6 is formed by spirally connecting the coil conductive patterns 57 of the insulating layers 51J, 51K via through holes.

Figure 6:
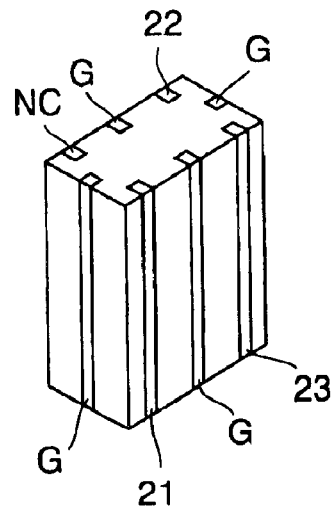
FIG. 6 is a perspective view of the second embodiment of the laminated electronic component of this invention.

At the stacked body stacked in this way, as shown in FIG. 6, there are formed unbalanced terminal 21, balanced terminals 22, 23, four ground terminals G, and a dummy terminal NC. Further, the capacity conductive pattern 58B is connected to the unbalanced terminal 21, the earth conductive patterns 52A, 52B are connected to the ground terminals G, common connecting end of the coil conductive pattern 56 and the coil conductive pattern 57 of the insulating layer 51J is connected to the ground terminals G, the coil conductive pattern 56 of the insulating layer 51K is connected to the balanced terminal 22, and the coil conductive pattern 57 of the insulating layer 51K is connected to the balanced terminal 23.

Figure 7:
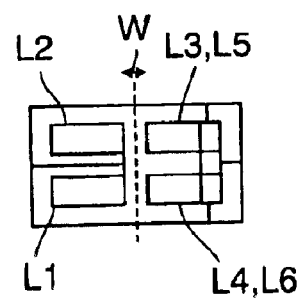
FIG. 7 is a top view of the second embodiment of the laminated electronic component of this invention.

In the laminated electronic component formed in this way, band-pass filter is formed at one side (left half in FIG. 7) and balun is formed at the other side (right half in FIG. 7) with center line being as reference in such a manner that the band-pass filter and the balun are laterally arranged when the stacked body is viewed from the stacking direction of the insulating layer as shown in FIG. 7. In addition, coils L1, L2 constituting the band-pass filter and coils L3, L4, L5, L6 constituting the balun may be formed so that their spacings W have more than 200 μm.

Figures 8, 9:
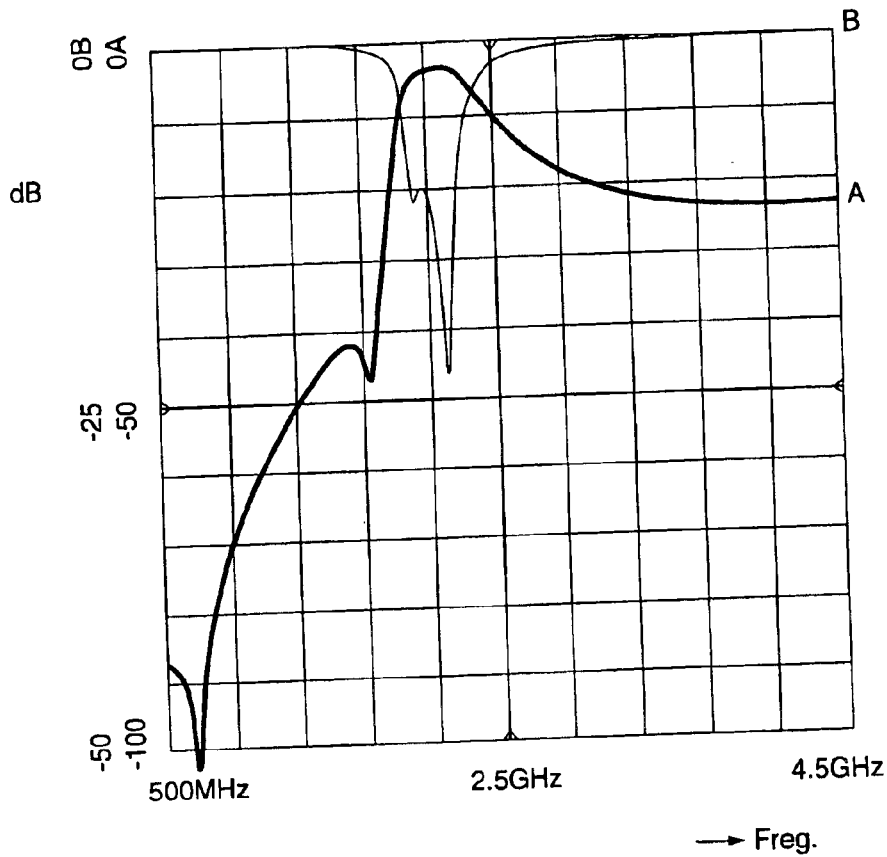
FIG. 8 is a graph showing the characteristic of the second embodiment of the laminated electronic component of this invention.
FIG. 9 is a Table showing the characteristics of the second to fifth embodiments of the laminated electronic component of this invention.

In such laminated electronic component, when line width of the coil conductive pattern of the band-pass filter is caused to be 100 μm, and line width of the coil conductive pattern of the balun is caused to be 75 μm, it is possible to obtain the characteristic that, at the passband of 2.11 to 2.17 GHz, attenuation pole is formed in the vicinity of 1.7 GHz as indicated by FIGS. 8 and 1 of FIG. 9. In the case where this laminated electronic component is used, it is possible to pass signal of W-CDMA band, and to attenuate DCS1800 MHz. In addition, dimensions of the laminated electronic component at this time were such that length and breadth are 3.2 mm×1.6 mm, and height is 1 mm. In FIG. 8, the abscissa represents frequency and the ordinate represents attenuation, and the transmission characteristic is indicated at A and the reflection characteristic is indicated at B.

Figure 10:
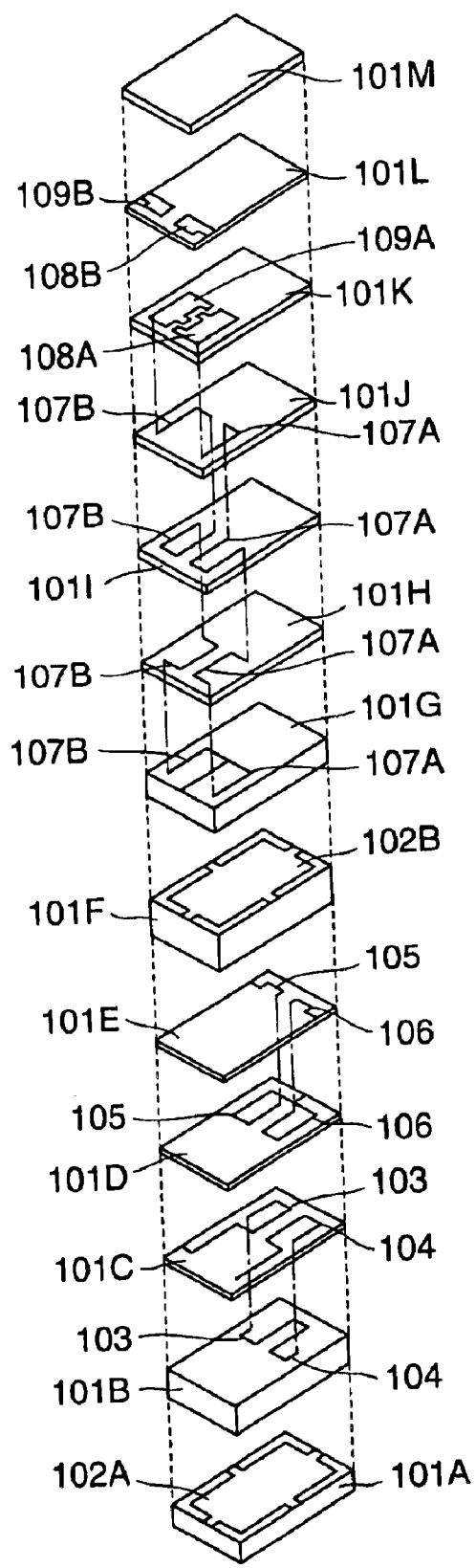
FIG. 10 is an exploded perspective view showing the third embodiment of the laminated electronic component of this invention.

FIG. 10 is an exploded perspective view showing a third embodiment of the laminated electronic component of this invention.

On the surface of an insulating layer 101A, a conductive pattern 102A for earth is formed.

At one side half surface (right half surface) of surfaces of insulating layers 101B, 101C, conductive patterns 103, 104 for coil are formed. The coil conductive patterns 103 of the insulating layers 101B, 101C are spirally connected. Moreover, the coil conductive patterns 104 of the insulating layers 101B, 101C are spirally connected. The coil L3 and the coil L4 connected in serries are formed by these coil conductive patterns 103, 104.

At one side half surface (right half surface) of the surfaces of insulating layers 101D, 101E, conductive patterns 105, 106 for coil are formed. The coil conductive patterns 105 of the insulating layers 101D, 101E are spirally connected. Moreover, the coil conductive patterns 106 of the insulating layers 101D, 101E are spirally connected. The coil L5 and the coil L6 are formed by the coil conductive patterns 105, 106.

On the surface of an insulating layer 101F, a conductive pattern 102B for earth is formed.

At one side half surface (left half surface) of the surfaces of insulating layers 101G to 101J, conductive patterns 107A, 107B for coil are formed. The coil conductive patterns 107A of the insulating layers 101G to 101J are spirally connected. Moreover, the coil conductive patterns 107B of the insulating layers 101G to 101J are spirally connected. The coil L1 and the coil L2 are formed by these coil conductive patterns 107A, 107B.

At one side half surface (left half surface) of the surface of an insulating layer 101K, a conductive pattern 108A for capacity and a conductive pattern 109A for capacity are formed. The capacity conductive pattern 108A is connected to the coil conductive pattern 107A. In addition, the capacity conductive pattern 109A is connected to the coil conductive pattern 107B.

At the one side half surface (left half surface) of the surface of an insulating layer 101L, a conductive pattern 108B for capacity and a conductive pattern 109B for capacity are formed. The capacitor C4 is formed between the capacity conductive pattern 108A and the capacity conductive pattern 108B. Moreover, the capacitor C5 is formed between the capacity conductive pattern 109A and the capacity conductive pattern 109B. Further, the capacity conductive pattern 109B is connected to the coil conductive pattern 103 of the insulating layer 101C through external electrode provided at the side surface of the stacked body.

In such laminated electronic component, when line width of the coil conductive pattern of the band-pass filter is caused to be 100 μm and line width of the coil conductive pattern of the balun is caused to be 75 μm, it is possible to obtain the characteristic that, at the passband of 2.11 to 2.17 GHz, attenuation pole is formed in the vicinity of 1.7 GHz as indicated by 2 of FIG. 9. In the case where this laminated electronic component is used, it is possible to pass signal of W-CDMA band, and to attenuate DCS1800 MHz band. In addition, dimensions of the laminated electronic component at this time were such that length and breadth are 3.2 mm×1.6 mm and height is 1 mm.

Figure 11:
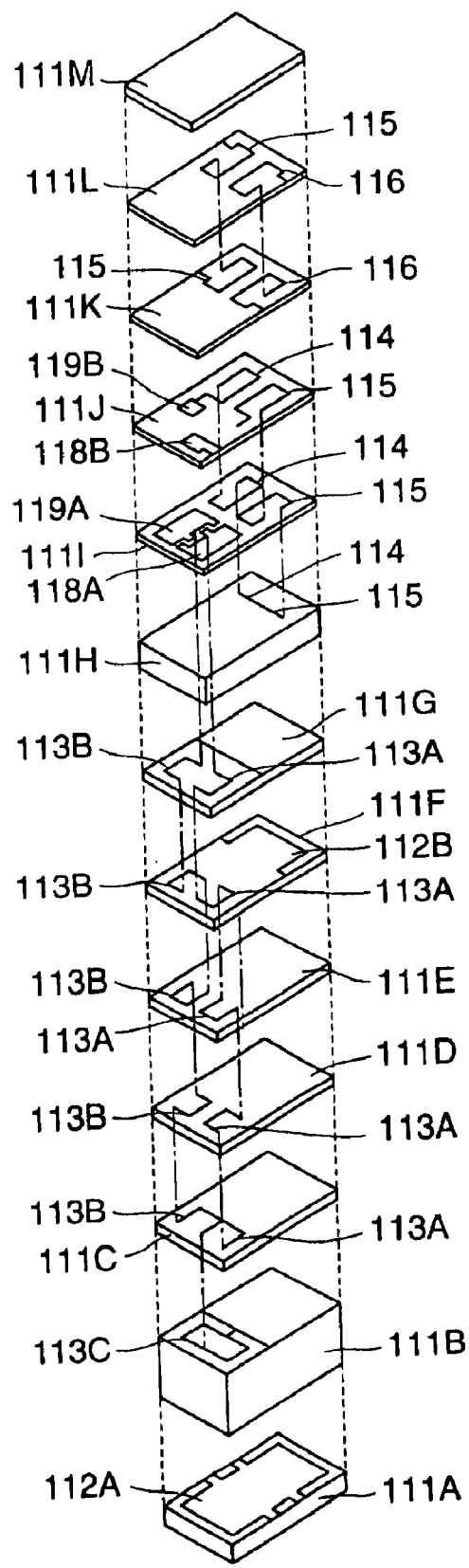
FIG. 11 is an exploded perspective view showing the fourth embodiment of the laminated electronic component of this invention.

FIG. 11 is an exploded perspective view showing a fourth embodiment of the laminated electronic component of this invention.

On the surface of an insulating layer 111A, a conductive pattern 112A for earth is formed. The earth conductive pattern 112A is respectively drawn out by two toward opposite end surfaces of the insulating layer 111A.

On the surface of an insulating layer 111B, a conductive pattern 113C for coil is formed at one side half surface (left half surface).

At one side half surface (left half surface) of the surfaces of insulating layers 111C to 111G, conductive patterns 113A, 113B for coil are formed. These coil conductive patterns 113A, 113B form the coil L1 and the coil L2. In addition, at the remaining half surface (right half surface) of the surface of the insulating layer 111F, a conductive pattern 112B for earth is formed.

At one side half surface (right half surface) of the surfaces of insulating layers 111H to 111J, conductive patterns 114, 115 for coil are formed. These coil conductive patterns 114, 115 form the coil L3 and the coil L4 connected in series. Moreover, at the remaining half surface (left half surface) of the surface of the insulating layer 111I, a conductive pattern 118A for capacity and a conductive pattern 119A for capacity are formed. The capacity conductive pattern 118A is connected to the coil conductive pattern 113A. Moreover, the capacity conductive pattern 119A is connected to the coil conductive pattern 113B. Further, at the remaining half surface (left half surface) of the surface of the insulating layer 111J, a conductive pattern 118B for capacity and a conductive pattern 119B for capacity are formed. The capacity conductive pattern 119B is connected to the coil conductive pattern 114 of the insulating layer 111J. The capacitor C4 is formed between the capacity conductive pattern 118A and the capacity conductive pattern 118B. In addition, the capacitor C5 is formed between the capacity conductive pattern 119A and the capacity conductive pattern 119B.

At one side half surface (right half surface) of the surfaces of insulating layers 111K, 111L, conductive patterns 115, 116 for coil are formed. These coil conductive patterns 115, 116 form the coil L5 and the coil L6.

Figure 12:
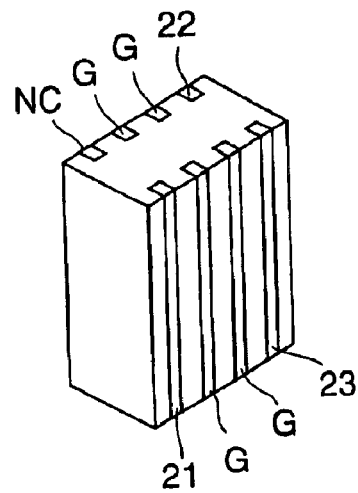
FIG. 12 is a perspective view of the fourth embodiment of the laminated electronic component of this invention.

At the stacked body stacked in this way, external terminals are formed by four at opposite side surfaces as shown in FIG. 12.

In such laminated electronic component, when line width of the coil conductive pattern of the band-pass filter is caused to be 100 μm and line width of the coil conductive pattern of the balun is caused to be 75 μm, it is possible to obtain the characteristic that, at the passband of 2.4 to 2.5 GHz, attenuation pole is formed in the vicinity of 1.98 GHz as indicated by 3 of FIG. 9. In the case where this laminated electronic component is used, it is possible to pass signal of the Bluetooth band, and to attenuate the W-CDMA band. In addition, dimensions of the laminated electronic component at this time were such that length and breadth are 3.2 mm×1.6 mm, and height is 1 mm.

FIG. 13 is an exploded perspective view showing a fifth embodiment of the laminated electronic component of this invention.

On the surface of an insulating layer 131A, a conductive pattern 132A for earth is formed. The earth conductive pattern 132A is respectively drawn out by one toward opposite end surfaces of the insulating layer 131A.

The coil L1 and the coil L2 are formed by a conductive pattern 133C for coil formed at one side half surface (left half surface) of the surface of an insulating layer 131 B and conductive patterns 133A, 133B for coil formed at one side half surface (left half surface) of the surfaces of insulating layers 131C to 131G. Moreover, at the remaining half surface (right half surface) of the surface of the insulating layer 131F, a conductive pattern 132B for earth is formed.

The coil L3 and the coil L4 connected in series are formed by conductive patterns 134, 135 for coil formed at one side half surface (right half surface) of the surfaces of insulating layers 131H to 131J. Moreover, the capacitor C4 and the capacitor C5 are formed by conductive patterns 138A, 139A for capacity formed at the remaining half surface of the surface of the insulating layer 131 I and conductive patterns 138B, 139B for capacity formed at the remaining half surface of the surface of the insulating layer 131J.

The coil L5 and the coil L6 are formed by conductive patterns 136, 137 for coil formed at one side half surface of the surfaces of insulating layers 131K, 131L.

At the stacked body stacked in this way, external terminals are formed by three at opposite side surfaces as shown in FIG. 14.

In such laminated electronic component, when line width of the coil conductive pattern of the band-pass filter is caused to be 100 µm and line width of the coil conductive pattern of the balun is caused to be 75 µm, it is possible to obtain the characteristic that, at the passband of 2.4 to 2.5 GHz, attenuation pole is formed in the vicinity of 2 GHz as indicated by 4 of FIG. 9. In the case where this laminated electronic component is used, it is possible to pass signal of Bluetooth band, and to attenuate W-CDMA band. In addition, dimensions of the laminated electronic component at this time were such that length and breadth are 3.2 mm×1.6 mm and height is 1 mm.

Figure 15:
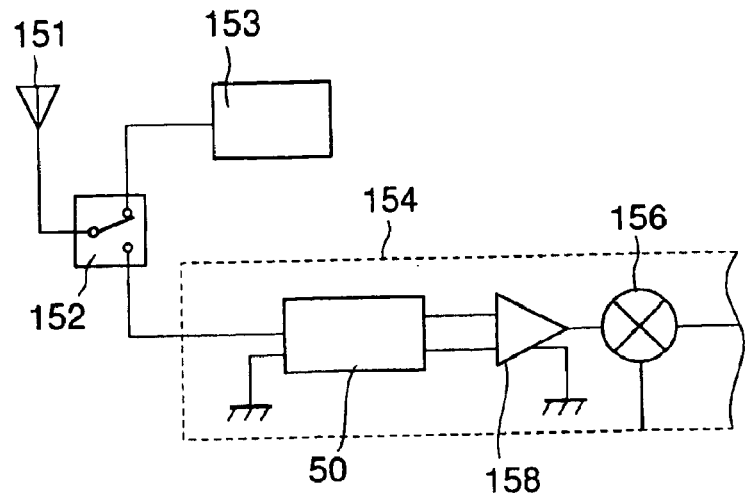
FIG. 15 is a circuit diagram showing another circuit example of the high frequency (microwave) communication equipment using the laminated electronic component of this invention.

FIG. 15 is a circuit diagram showing another circuit example of a high frequency (microwave) communication equipment using the laminated electronic component of this invention.

In this mobile communication terminal, an antenna 151 is connected to common terminal of a switching element 152, and a receiving circuit 153 and a transmitting circuit 154 are respectively connected to branch ends of the switching element 152. Further, a laminated electronic component 50 of this invention is inserted between the switching element 152 and the input terminal of IC of the balanced input/output type used in a high frequency amplifier 158 of the transmitting circuit 154.

Figure 16:
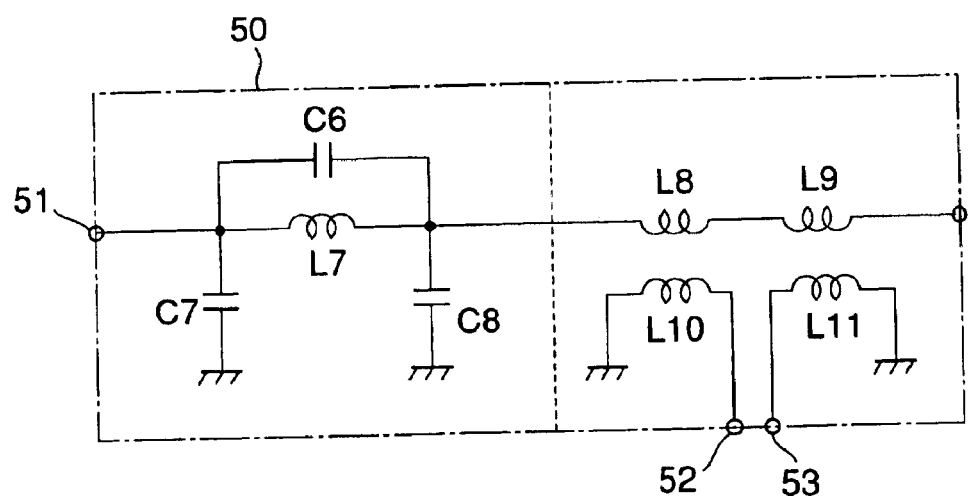
FIG. 16 is a circuit diagram showing the laminated electronic component of this invention shown in FIG. 15.

The filter and the balun of this laminated electronic component 50 are constituted, as shown in FIG. 16, for example, by a low-pass filter in which a coil L7 and a capacitor C6 are connected in parallel, a capacitor C7 is connected between one end of the coil L7 and earth, and a capacitor C8 is connected between the other end of the coil L7 and earth, and a balun of the so-called marchand type in which a coil L8 and a coil L9 are connected, a coil L10 having one end grounded is electromagnetically coupled to the coil L8, and a coil L11 having one end grounded is electromagnetically coupled to the coil L9. The low-pass filter and the balun are connected between an unbalanced terminal 51 and balanced terminals 52, 53.

Figure 17:
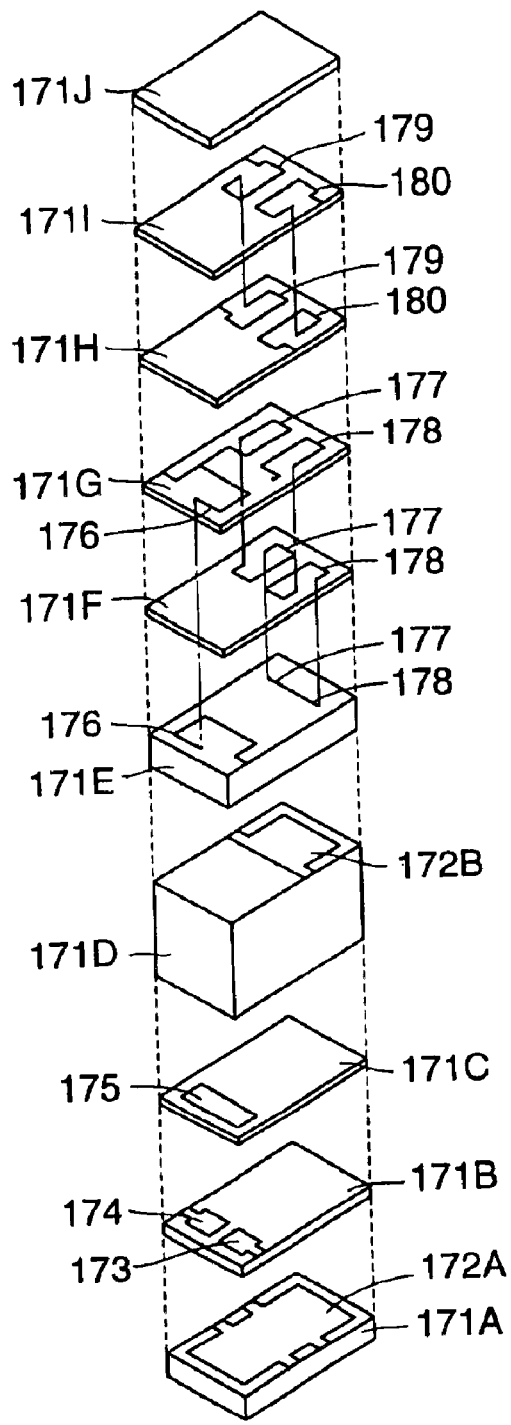
FIG. 17 is an exploded perspective view showing a sixth embodiment of the laminated electronic component of this invention.

Such filter and balun are formed within stacked body obtained by stacking insulating layers and conductive patterns as shown in FIG. 17.

The insulating layers 171A to 171J are formed by using material having insulating property such as magnetic material, non-magnetic material or dielectric material, etc.

On the surface of the insulating layer 171A, a conductive pattern 172A for earth is formed.

At one side half surface (left half surface in FIG. 17) of the surface of the insulating layer 171B, conductive patterns 173, 174 for capacity are formed. The capacitor C7 is formed between the earth conductive pattern 172A and the capacity conductive pattern 173. Moreover, the capacitor C8 is formed between the earth conductive pattern 172A and the capacity conductive pattern 174.

At one side half surface (left half surface) of the surface of the insulating layer 171C, a conductive pattern 175 for capacity is formed. The capacitor C6 is formed by the capacity conductive pattern 175 and the capacity conductive patterns 173, 174.

On the surface of the insulating layer 171D, a conductive pattern 172B for earth is formed.

The coil L7 is formed by spirally connecting a conductive pattern 176 for coil formed at one side half surface (left half surface) of the surface of the insulating layer 171E and the conductive pattern 176 for coil formed at one side half surface (left half surface) of the surface of the insulating layer 171G.

The coil L8 and the coil L9 connected in series are formed by conductive patterns 177, 178 for coil formed at the remaining half surface (right half surface) of the surface of the insulating layer 171E, conductive patterns 177, 178 for coil formed at one side half surface (right half surface) of the surface of the insulating layer 171F, and conductive patterns 177, 178 for coil formed at the remaining half surface (right half surface) of the surface of the insulating layer 171G. The coil L8 and the coil L7 constituting the low-pass filter are connected to each other by connecting the coil conductive pattern 176 and the coil conductive pattern 177 of the insulating layer 171G.

The coil L10 and the coil L11 are formed by conductive patterns 179, 180 for coil formed at the remaining half surface (right half surface) of the surfaces of the insulating layers 171H, 171I.

Figure 18:
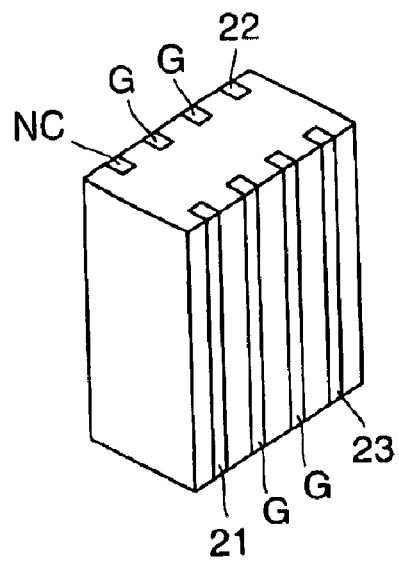
FIG. 18 is a perspective view of the sixth embodiment of the laminated electronic component of this invention.

At the stacked body stacked in this way, external terminals are formed by four at opposite side surfaces as shown in FIG. 18.

Figure 19:
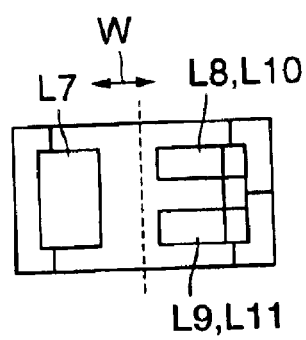
FIG. 19 is a top view of the sixth embodiment of the laminated electronic component of this invention.

In the laminated electronic component formed in this way, as shown in FIG. 19, when the stacked body is viewed from a stacking direction of the insulating layers, lowpass filter is formed at one side (left half in FIG. 19) and balun is formed at the other side (right half in FIG. 19) with center line being as reference in such a manner that the low-pass filter and the balun are laterally arranged. In addition, the coil L7 constituting the low-pass filter and the coils L8, L9, L10, L11 constituting the balun are formed so that their spacings W have more than 300 µm.

Figure 20:
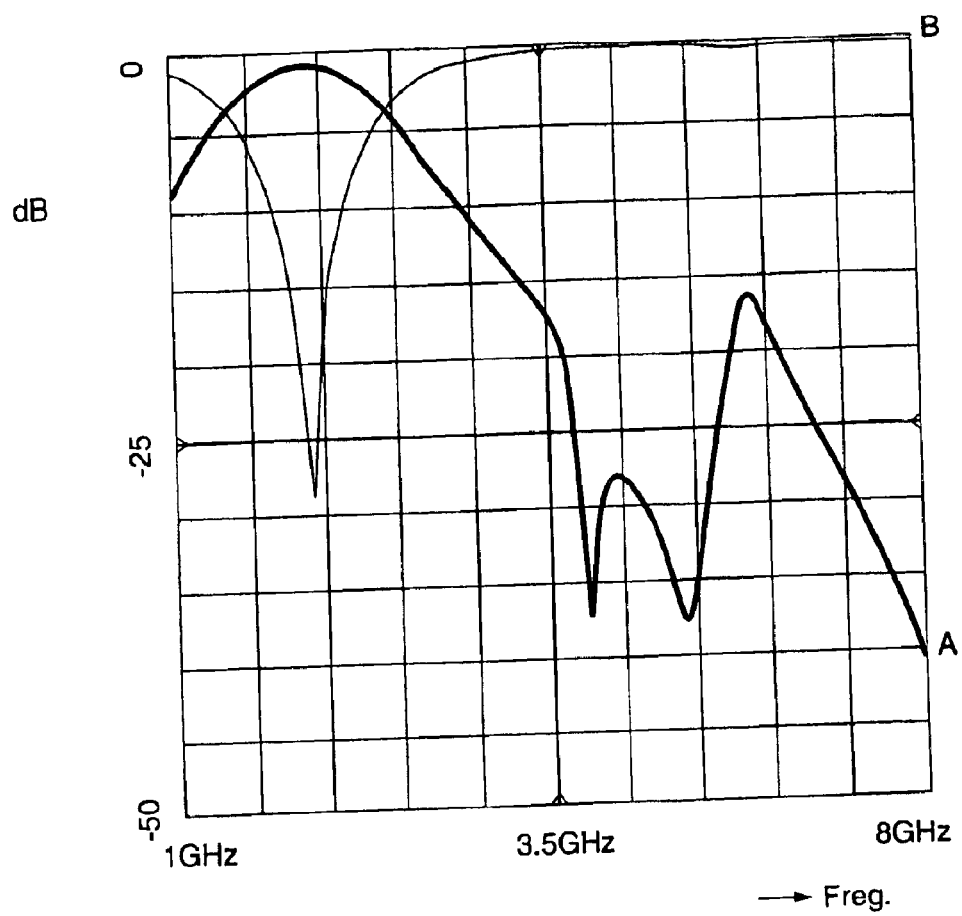
FIG. 20 is a graph showing the characteristic of the sixth embodiment of the laminated electronic component of this invention.

In such laminated electronic component, when the line width of the coil conductive pattern of the low-pass filter is caused to be 100 µm and the line width of the coil conductive pattern of the balun is caused to be 75 µm, it is possible to obtain the characteristic that, at the passband of 2.4 to 2.5 GHz, attenuation pole is formed in the vicinity of 5 GHz as shown in FIG. 20. In the case where this laminated electronic component is used, it is possible to pass signal of the Bluetooth band, and to attenuate double higher harmonic component. In addition, dimensions of the laminated electronic component at this time were such that length and breadth are 3.2 mm×1.6 mm and height is 1 mm. In FIG. 20, the abscissa represents frequency and the ordinate represents attenuation, and transmission characteristic is indicated at A and reflection characteristic is indicated at B.

Figure 21:
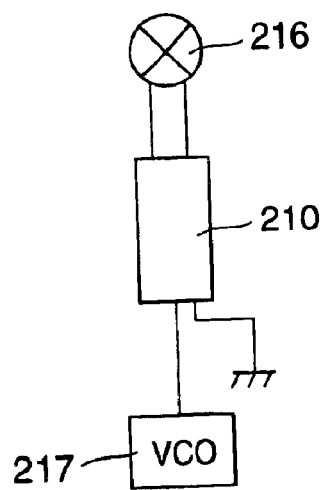
FIG. 21 is a circuit diagram showing a still further circuit example of the high frequency (microwave) communication equipment using the laminated electronic component of this invention.
Figure 22:
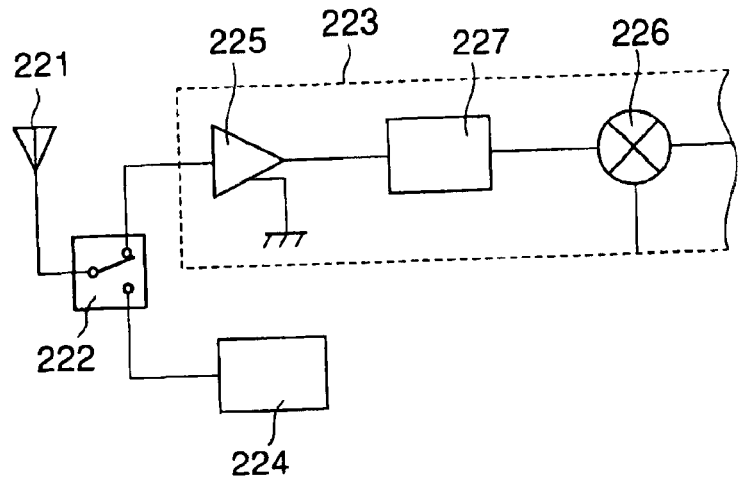
FIG. 22 is a circuit diagram of a high frequency (microwave) communication equipment.
Figure 23:
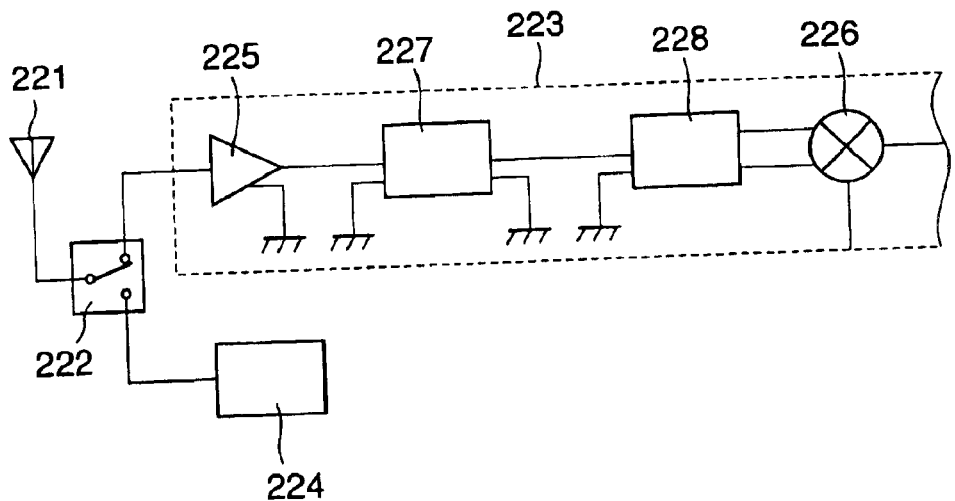
FIG. 23 is a circuit diagram of another high frequency (microwave) communication equipment.

FIG. 21 is a circuit diagram showing a further circuit example of the high frequency (microwave) communication equipment using the laminated electronic component of this invention.

FIG. 21 shows a portion of a circuit of a mobile communication terminal. In this mobile communication terminal, a laminated electronic component 210 of this invention is inserted between the input terminal of IC of the balanced input/output type used in a frequency mixer 216 and the output terminal of a VCO 217.

In this laminated electronic component 210, a filter connected to the unbalanced terminal and a balun connected between this filter and a pair of balanced terminals are formed within the stacked body of insulating layers and conductive patterns. In this laminated electronic component 210, the unbalanced terminal is connected to the unbalanced transmission line connected to the output terminal of the VCO 217, and a pair of balanced terminals are connected to the balanced transmission line connected to the input terminal of IC of the balanced input/output type used in the frequency mixer 216.

While the embodiments of the laminated electronic component of this invention have been described above, this invention is not limited to these embodiments. For example, with respect to the balun, while explanation has been given in connection with balun of the marchand type in the embodiments, balun of the pure transmission type, or balun of the ttt type may be employed. Moreover, the band-pass filter and the balun may be adapted so that conductive patterns for coil constituting coil L3 and conductive patterns for capacity constituting capacitor C5 are connected via through holes of insulating layers. Further, in the second to fifth embodiments, two conductive patterns for capacity constituting capacitor C3 may be formed in a manner opposite to each other through an insulating layer. Furthermore, the band-pass filter may be caused to be of various circuit configurations.

Further, the low-pass filter and the balun may be connected by connecting conductive patterns for coil constituting coil L7 and conductive patterns for coil constituting coil L8 through external terminal, or connecting them via through holes of insulating layers. Further, the low-pass filter and the balun may be formed within stacked body so that they are stacked in a stacking direction of the stacked body. Furthermore, the low-pass filter may be caused to be of various configurations.

In addition, while the case of the mobile communication terminal has been explained as high frequency (microwave) communication equipment in the embodiments, laminated electronic component may be inserted between the unbalanced line and the balanced line, and this invention can be applied also to wireless LAN.

Advantages of the Invention

As described above, the laminated electronic component of this invention is adapted to stack insulating layers and conductive patterns to form filter and balun within the stacked body to connect the filter and the balun between the unbalanced terminal and a pair of balanced terminals. As a result, it is possible to set output impedance of filter so that the characteristic of the filter becomes satisfactory without undergoing influence of output impedance of balun required.

Accordingly, the laminated electronic component of this invention can contribute to miniaturization of high frequency (microwave) communication equipment, and can improve the characteristic of the filter as compared to the prior art one.

What is claimed is:

1. A laminated electronic component in which insulating layers and conductive patterns are stacked to form a filter and a balun within the stacked body to connect the filter and the balun between an unbalanced terminal and a pair of balanced terminals wherein the filter is band-pass filter.

2. A laminated electronic component in which insulating layers and conductive patterns are stacked to form a filter and a balun within the stacked body to connect the filter and the balun between an unbalanced terminal and a pair of balanced terminals, wherein the filter and the balun are formed within the stacked body in the state laterally shifted so that they are not overlaid with each other.

3. A laminated electronic component according to claim 2, wherein a coil or coils constituting the filter and coils constituting the balun are disposed in the state shifted in a stacking direction.

4. A laminated electronic component according to claim 2, wherein the filter and the balun are connected to each other by connecting, on the same insulating layer, conductive patterns constituting filter and conductive patterns constituting balun formed on the same insulating layer.

5. A laminated electronic component according to claim 2, wherein the filter and the balun are connected to each other through external electrodes provided at the stacked body or through holes provided at the insulating layers.

6. A laminated electronic component in which insulating layers and conductive patterns are stacked to form, within the stacked body, a band-pass filter in which a first resonator and a second resonator are electromagnetically coupled and a balun in which a first coil and a second coil are connected, a third coil having one end grounded is electromagnetically coupled to the first coil, and a fourth coil having one end grounded is electromagnetically coupled to the second coil, the band-pass filter and the balun being connected between an unbalanced terminal and a pair of balanced terminals.

7. A laminated electronic component according to claim 6, wherein the band-pass filter and the balun are formed within the stacked body in the state laterally shifted so that they are not overlaid with each other.

8. A laminated electronic component according to claim 7, wherein coils constituting the band-pass filter and coils constituting the balun are disposed in the state shifted in a stacking direction.

9. A laminated electronic component according to claim 7, wherein the band-pass filter and the balun are connected to each other, on the same insulating layer, by connecting conductive patterns constituting band-pass filter and conductive patterns constituting balun formed on the same insulating layer.

10. A laminated electronic component according to claim 7, wherein the band-pass filter and the balun are connected to each other through external electrodes provided at the stacked body or through holes provided at the insulating layers.

11. A laminated electronic component according to claim 6, wherein the band-pass filter and the balun are formed within the stacked body so that they are stacked with each other in a stacking direction of the stacked body.

12. A laminated electronic component in which insulating layers and conductive patterns are stacked to form, within the stacked body, a low-pass filter in which a first coil and a first capacitor are connected in parallel, a second capacitor is connected between one end of the first coil and earth and a third capacitor is connected between the other end of the first coil and earth, and a balun in which a second coil and a third coil are connected, a fourth coil having one end grounded is electromagnetically coupled to the second coil, and a fifth coil having one end grounded is electromagnetically coupled to the third coil, the low-pass filter and the balun being connected between an unbalanced terminal and a pair of balanced terminals.

13. A laminated electronic component according to claim 12, wherein the low-pass filter and the balun are formed within the stacked body in the state laterally shifted so that they are not overlaid with each other.

14. A laminated electronic component according to claim 13, wherein a coil constituting the low-pass filter and coils constituting the balun are disposed in the state shifted in a stacking direction.

15. A laminated electronic component according to claim 13, wherein the low-pass filter and the balun are connected to each other by connecting, on the same insulating layer, conductive patterns constituting low-pass filter and conductive patterns constituting balun formed on the same insulating layer.

16. A laminated electronic component according to claim 13, wherein the low-pass filter and the balun are connected to each other through external electrodes provided at the stacked body, or through holes provided at the insulating layers.

17. A laminated electronic component according to claim 12, wherein the low-pass filter and the balun are formed within the stacked body so that they are stacked with each other in a stacking direction of the stacked body.

* * * * *